(12) United States Patent
Drapkin et al.

(10) Patent No.: US 8,618,836 B1
(45) Date of Patent: Dec. 31, 2013

(54) COMPLEMENTARY METAL OXIDE SEMICONDUCTOR (CMOS) BUFFER

(75) Inventors: Oleg Drapkin, Richmond Hill (CA); Grigori Temkine, Markham (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/533,042

(22) Filed: Jun. 26, 2012

(51) Int. Cl.
 *H03K 19/094* (2006.01)
(52) U.S. Cl.
 USPC .................................. 326/83; 326/34; 326/68
(58) Field of Classification Search
 None
 See application file for complete search history.

(56) References Cited

U.S. PATENT DOCUMENTS 7,259,614 B1 * 8/2007 Baker et al. .................... 327/538

* cited by examiner

*Primary Examiner* — Jany Richardson

(57) ABSTRACT

The present invention provides embodiments of an apparatus that includes a pad configurable for connection to a voltage source that provides a first voltage and a buffer connected to the pad. The buffer includes a plurality of transistors that have nominal breakdown voltages that are less than the first voltage. The buffer is configured to maintain voltage differentials on the plurality of transistors that are less than the break-down voltage of the plurality of transistors during pull-down of a pad voltage from the first voltage to a selected low voltage level or during pull-up of the pad voltage from the selected low voltage level to the first voltage.

18 Claims, 7 Drawing Sheets

COMPLEMENTARY METAL OXIDE SEMICONDUCTOR (CMOS) BUFFER

BACKGROUND

This application relates generally to semiconductor devices, and, more particularly, to CMOS buffers that may be implemented in semiconductor devices.

Semiconductor devices are conventionally fabricated on chips or die using combinations of deposition, photolithography, etching, annealing, polishing/planarization, and metrology processes. Different fabrication processes can be characterized by the typical critical dimensions of transistors that are formed by the process. For example, semiconductor fabrication facilities can be configured to perform 130 nm processes, 90 nm processes, 65 nm processes, 45 nm processes, and the like. The semiconductor devices can be physically, electronically, or communicatively coupled to external devices using interfaces such as the inter-integrated circuit ($I^2C$) interface or the Universal Serial Bus (USB) interface. However, such legacy interfaces to semiconductor devices or chips may operate using a high voltage level that is higher than the breakdown voltage for transistors using some fabrication processes.

SUMMARY OF EMBODIMENTS

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later. One embodiment includes a pad on a CMOS chip that provides a connection to an interface that uses a high voltage (e.g., 3.3 V). The pad is connected to a buffer that can maintain voltage differentials on the transistors in the buffer that are less than the transistors' break-down voltage while the pad voltage is being pulled down from the first voltage to 0 V (or some other low voltage level). The buffer is also configured to maintain voltage differentials on the transistors that are less than the transistors' break-down voltage while the pad voltage is being pulled up from 0 V to the first voltage. Thus, the buffer may be fabricated using smaller transistors that have smaller breakdown voltages.

In one embodiment, an apparatus is provided that includes a pad configurable for connection to a voltage source that provides a first voltage. The apparatus also includes a buffer connected to the pad. The buffer includes a plurality of transistors that have nominal breakdown voltages that are less than the first voltage. The buffer is configured to maintain voltage differentials on the plurality of transistors that are less than the break-down voltage of the plurality of transistors during pull-down of a pad voltage from the first voltage to a selected low voltage level or during pull-up of the pad voltage from the selected low voltage level to the first voltage.

In another embodiment, an apparatus is provided that includes a pad configurable for connection to a voltage source that provides a first voltage, a buffer connected to the pad, and core logic communicatively coupled to the buffer. The buffer includes a plurality of transistors that have nominal breakdown voltages that are less than the first voltage. The core logic is configurable to provide a data signal and input signals to the buffer to drive a pad voltage to a value indicated by the data signal. The buffer is configured to maintain voltage differentials on the plurality of transistors that are less than a break-down voltage of the plurality of transistors during pull-down of a pad voltage from the first voltage to a selected low voltage level or during pull-up of the pad voltage from the selected low voltage level to the first voltage.

In yet another embodiment, a computer readable media is provided including instructions that when executed can configure a manufacturing process used to manufacture a semiconductor device that includes a pad configurable for connection to a voltage source that provides a first voltage and a buffer connected to the pad. The buffer includes a plurality of transistors that have nominal breakdown voltages that are less than the first voltage. The buffer is configured to maintain voltage differentials on the plurality of transistors that are less than the break-down voltage of the plurality of transistors during pull-down of a pad voltage from the first voltage to a selected low voltage level or during pull-up of the pad voltage from the selected low voltage level to the first voltage.

In a further embodiment, a computer readable media is provided including instructions that when executed can configure a manufacturing process used to manufacture a semiconductor device that includes a pad configurable for connection to a voltage source that provides a first voltage, a buffer connected to the pad, and core logic communicatively coupled to the buffer. The buffer includes a plurality of transistors that have nominal breakdown voltages that are less than the first voltage. The core logic is configurable to provide a data signal and input signals to the buffer to drive a pad voltage to a value indicated by the data signal. The buffer is configured to maintain voltage differentials on the plurality of transistors that are less than a break-down voltage of the plurality of transistors during pull-down of a pad voltage from the first voltage to a selected low voltage level or during pull-up of the pad voltage from the selected low voltage level to the first voltage.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
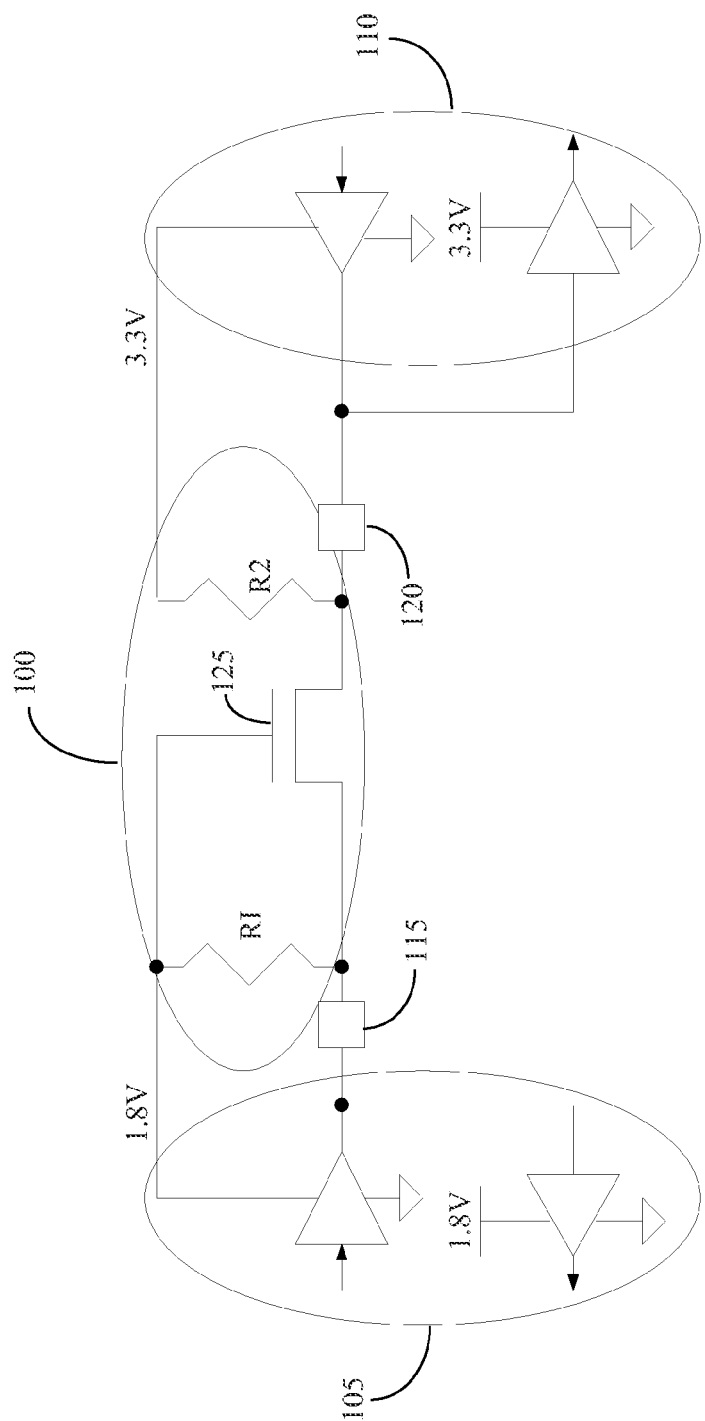
FIG. 1 conceptually illustrates one exemplary embodiment of an external interface that is used to couple a low-voltage chip buffer to a high voltage buffer.

While the disclosed subject matter may be modified and may take alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. The description and drawings merely illustrate the principles of the claimed subject matter. It should thus be appreciated that those skilled in the art may be able to devise various arrangements that, although not explicitly described or shown herein, embody the principles described herein and may be included within the scope of the claimed subject matter. Furthermore, all examples recited herein are principally intended to be for pedagogical purposes to aid the reader in understanding the principles of the claimed subject matter and the concepts contributed by the inventor(s) to furthering the art, and are to be construed as being without limitation to such specifically recited examples and conditions.

The disclosed subject matter is described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition is expressly set forth in the specification in a definitional manner that directly and unequivocally provides the special definition for the term or phrase. Additionally, the term, "or," as used herein, refers to a non-exclusive "or," unless otherwise indicated (e.g., "or else" or "or in the alternative"). Also, the various embodiments described herein are not necessarily mutually exclusive, as some embodiments can be combined with one or more other embodiments to form new embodiments.

Semiconductor fabrication techniques are constantly evolving to make transistors that are smaller and faster. For example, fabrication facilities that are configured to construct transistors with a critical dimension of 22 nm have been deployed and facilities that can fabricate even smaller transistors are in the pipeline. Although decreasing the transistor size and increasing the transistor speed has obvious advantages, smaller transistors are also more vulnerable to high voltages at least in part because they have lower breakdown voltages. Consequently, smaller transistors may not work reliably if the voltage difference between the drain, gate, source, or substrate of the transistor exceeds the breakdown voltage. For example, transistors formed using 40 nm processes (or larger) typically work reliably at voltages on the order of 3.3 V because their break-down voltage is more than 3.3V but smaller transistors (such as transistors formed using 28 nm or smaller processes) may be configured to work reliably at voltages on the order of 1.8 V. For example, the break-down voltage for transistors formed using 28 nm or smaller processes may be less than 3.3V but higher than 1.8V.

Legacy interfaces to semiconductor devices or chips may operate using a high voltage level that is higher than the breakdown voltage for the smaller transistors. For example, the Universal Serial Bus (USB) version 2.0 interface supports voltage differences on the order of 3.3 V. Smaller transistors could be cascaded to support the higher voltage interface if the drain-to-substrate electrical breakdown voltage for the transistors is larger than the high voltage used by the interface. However, the drain-to-substrate breakdown voltage for input/output NMOS transistors is lower than 3.3 V (but higher than 1.8V) for fabrication processes that create lower critical dimensions such as 28 nm, 22 nm, and lower. In that case, it is not possible to implement on-chip high-voltage interfaces such as $I^2C$ interfaces because they require a 3.3 V voltage supply, which would cause electrical breakdown and chip latch-up for incoming high-voltage levels. An additional external buffer may therefore be required to connect legacy interfaces to chips fabricated using transistors that have breakdown voltages that are smaller than the voltage differences generated by the legacy interface. The external components significantly increase the bill-of-material costs and consume additional current or power.

At least in part to support conventional interfaces to semiconductor devices that include smaller transistors, the present application describes embodiments of CMOS chips that include a pad that can be connected through an external pull-up to voltage supply that has a first voltage that corresponds to a high voltage (e.g., 3.3 V) required by an interface. The pad is connected to a buffer fabricated on the CMOS chip. The buffer includes a plurality of transistors and the breakdown voltage for the transistors in the buffer is less than the first voltage. The buffer is configured to maintain voltage differentials on the transistors that are less than the transistors' break-down voltage while the pad voltage is being pulled down from the first voltage to 0 V (or some other low voltage level). The buffer is also configured to maintain voltage differentials on the transistors that are less than the transistors' break-down voltage while the pad voltage is being pulled up from 0 V to the first voltage.

In one embodiment, the buffer includes a PMOS transistor and an NMOS transistor connected in series. A voltage tracking block provides a gate potential to the PMOS transistor based on the pad voltage level. The gate potential of the PMOS transistor can be negative when the pad provides an output of 0 V. A safety block controls a voltage at a node intermediate the PMOS transistor and the NMOS transistor so that voltages across the NMOS transistor are less than the NMOS transistor break-down voltage (which is on order of the second voltage) while the pad voltage is being pulled down from the first voltage to 0 V (or some other low voltage level) or while the pad voltage is being pulled up from the low voltage level to the first voltage. A control block provides a gate voltage to turn on the NMOS transistor while the pad voltage is being pulled down and a different gate voltage to turn off the NMOS transistor while the pad voltage is being pulled up.

FIG. 1 conceptually illustrates one exemplary embodiment of an external interface 100 that is used to couple a low-voltage chip buffer 105 to a high voltage buffer 110. In the illustrated embodiment, the low-voltage chip buffer 105 is formed using transistors that have a nominal breakdown voltage less than 3.3V. As used herein, the phrase "nominal breakdown voltage" indicates a voltage that can be expected to cause electrical breakdown of a reverse bias diode that is created by the drain (or source) and the substrate of the corresponding transistor. However, persons of ordinary skill in the art having benefit of the present disclosure should appreciate that variations in the fabrication process may produce individual transistors that may be able to withstand slightly higher voltages before breaking down or they may produce transistors that electrically break down when a slightly lower voltage than the nominal breakdown voltage is applied. In some embodiments, individual transistors may be designed to withstand voltages somewhat higher than the nominal breakdown voltage to provide a margin for error. However, even when a margin for error is included, at least some transistors should be expected to fail when voltages higher than the nominal breakdown voltage are applied. Moreover, the nominal breakdown voltage of the transistors may have different values in alternative embodiments.

The high-voltage buffer 110 is used to couple external devices to the low-voltage chip buffer 105 so that signals can be exchanged between the semiconductor device that includes the low-voltage chip buffer 105 and the external devices. The high-voltage buffer 110 represents the signals using voltage differentials that vary between two voltages, such as 0 V and 3.3 V. For example, a logical "0" may be represented by pulling the pad 120 down to 0 V and a logical "1" may be represented by pulling the pad 120 up to 3.3 V. However, as discussed herein, transistors in the buffer 105 may not be able to withstand voltages as large as 3.3 V because they have lower nominal breakdown voltages. The interface 100 may therefore be used as a level shifter. In the illustrated embodiment, the interface 100 includes resistors R1, R2 and NMOS transistors 125. The interface 100 functions as a 1.8 V to 3.3 V level shifter when the buffer 105 is in transmission mode so that signals may be transmitted from the buffer 105 to the buffer 110. The interface 100 may also function as a 3.3 V to 1.8 V level shifter when the buffer 110 is in transmission mode so that signals may be transmitted from the buffer 110 to the buffer 105.

The interface 100 shown in FIG. 1 is a distinct and separate entity that can be coupled to a pad 115 for the low-voltage chip buffer 105 and a pad 120 for the high voltage interface 110. Consequently, using the external interface 100 to couple the low-voltage buffer 105 and the high-voltage buffer 110 significantly increases the bill-of-material costs. The external interface 100 may also consume additional current or power. Moreover, the external interface 100 may have to be fabricated separately and then later combined with the chip that includes the buffer 105, which may significantly increase the complexity of the fabrication and assembly process.

Figure 2:
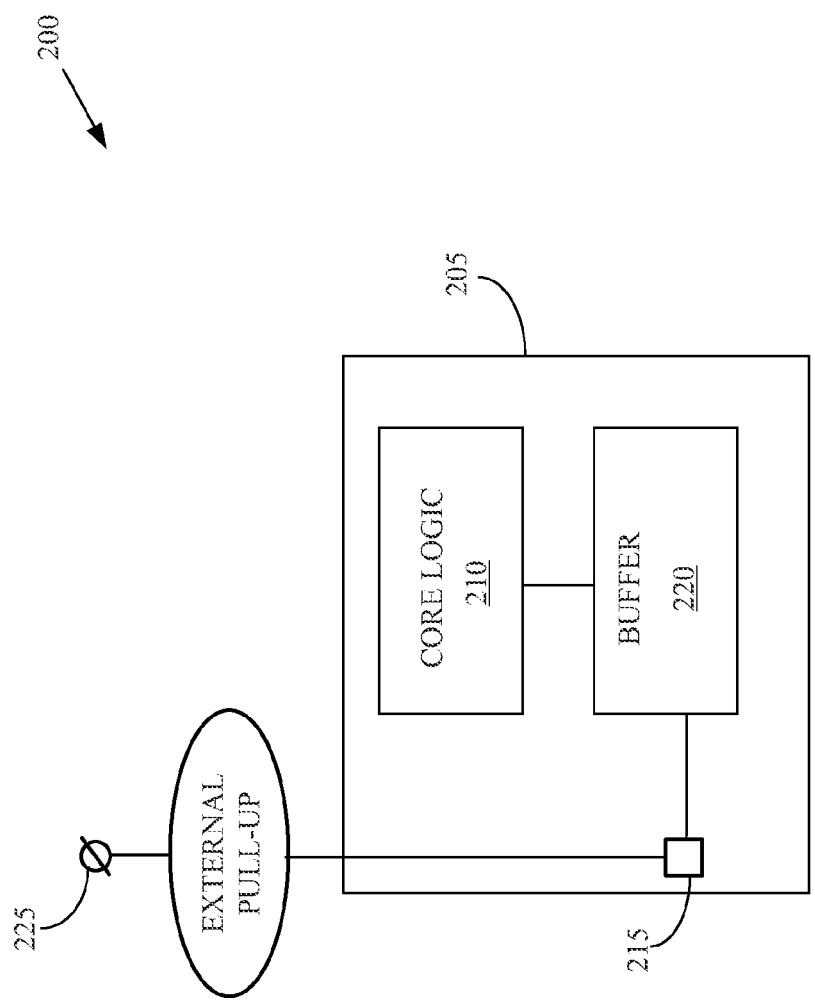
FIG. 2 conceptually illustrates a first exemplary embodiment of a semiconductor device.

FIG. 2 conceptually illustrates a first exemplary embodiment of a semiconductor device 200. In the illustrated embodiment, the semiconductor device 200 includes a chip 205. Core logic 210 is fabricated on the chip 205, e.g., using well known deposition, photolithography, etching, annealing, polishing, planarization, metrology, or other fabrication processes. In one embodiment, the core logic 210 may be configured to implement one or more processing units such as a central processing unit, a graphics processing unit, or an accelerated processing unit. However, alternative embodiments of the core logic 210 may be configured to implement other functionality. The core logic 210 may be physically, electromagnetically, or communicatively coupled to one or pads 215 (only one shown in FIG. 2) by one or more buffers 220. In the illustrated embodiment, the buffer 220 is a CMOS output buffer 220. However, in alternative embodiments, the buffer 220 may be configured as an input buffer.

In the illustrated embodiment, the pad 215 is also connected to voltage source 225 through an external pull up device. For example, the voltage source 225 may provide a high voltage such as a voltage of 3.3 V, which may correspond to a voltage used by a buffer or interface to an external device. Transistors in the core logic 210 or the buffer 220 may have a nominal breakdown voltage that is lower than 3.3 V. For example, transistors in the core logic 210 or the buffer 220 may have a nominal breakdown voltage that is slightly higher than 1.8 V. In the illustrated embodiment, the buffer 220 may therefore be configured to maintain voltage differentials on the buffer transistors that are less than the transistors' nominal break-down voltage during pull-down of a pad voltage from the high voltage to 0 V (or some other selected low voltage level) or during pull-up of the pad voltage from 0V (or some other selected low voltage level) to the high voltage. For example, the core logic 210 may provide a data signal (e.g., a signal indicating a logical 0 or a logical 1) to the buffer 220. The core logic 210 may also provide other input signals such as a pair of toggled signals that can drive the buffer 220 to pull down the pad voltage to the low voltage level, e.g., to indicate a logical 0. The core logic 210 may also provide input signals that cause the buffer 220 and the voltage source 225 to pull up the pad voltage to the high-voltage level, e.g., to indicate a logical 1.

Figure 3:
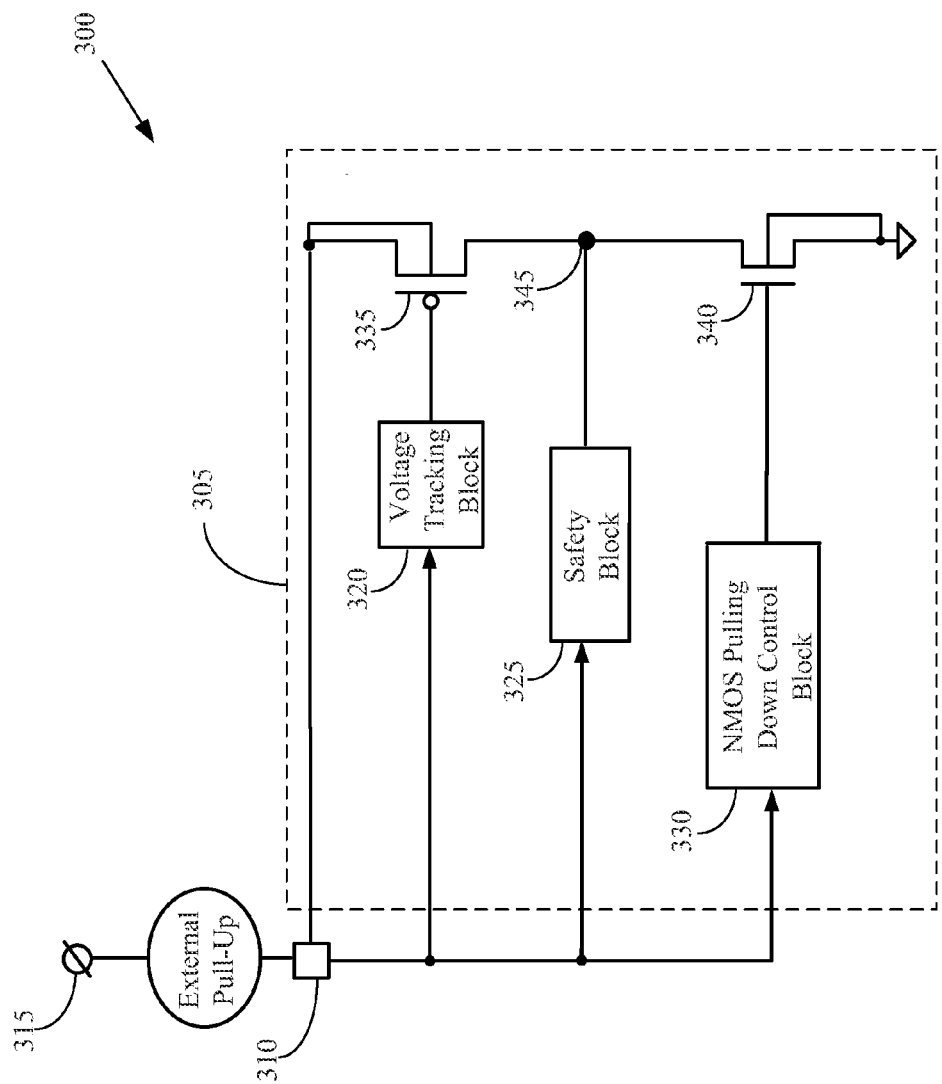
FIG. 3 conceptually illustrates a second exemplary embodiment of a semiconductor device.

FIG. 3 conceptually illustrates a second exemplary embodiment of a semiconductor device 300. In the illustrated embodiment, the semiconductor device 300 includes a buffer 305 that is connected to a pad 310. The pad 310 is also connected to source 315 through an external pull up device. For example, the voltage source 315 may provide a high-voltage of 3.3 V, which may correspond to a voltage used by a buffer or interface to an external device. Transistors in the buffer 305 may have a breakdown voltage, $V_B$, that is lower than 3.3V. The buffer 305 may therefore include elements configured to maintain voltage differentials on transistors in the buffer 305 below the nominal breakdown voltage. In the illustrated embodiment, the buffer 305 includes a voltage tracking block 320, a safety block 325, a control block 330, a PMOS transistor 335, and an NMOS transistor 340. The PMOS transistor 335 and the NMOS transistor 340 are connected in series between the pad 310 and ground. A source terminal for the PMOS transistor 335 is connected to a drain terminal for the NMOS transistor 340 via an intermediate node 345.

In the illustrated embodiment, the voltage tracking block 320 tracks the voltage level of the pad 310 and provides a gate potential to the gate of the PMOS transistor 335. The gate potential provided by the voltage tracking block 320 is determined based on the pad voltage level so that the gate potential varies to maintain voltage differentials on the PMOS transistor that are less than the breakdown voltage during pad output voltage transitions from the high voltage to the low voltage or vice versa. In one embodiment, the voltage tracking block 320 may provide a negative gate potential to the PMOS transistor 335 to turn on the PMOS transistor 335 when the pad 310 provides a 0 V output voltage level. For example, the voltage tracking block 320 may provide a gate potential of −1 V to turn on the PMOS transistor 335 when the pad 310 provides a 0 V output voltage level.

Safety block 325 is configured to control the potential at node 345 based on the voltage level of the pad 310. The safety block 325 varies the potential at the node 345 so that the voltage differential between the drain and substrate of the NMOS transistor 340 remains lower than the breakdown voltage during a pad output level transition from the high voltage provided by the voltage source 315 (e.g., 3.3 V) to a low output voltage level such as 0V. The safety block 325 may also vary the potential at the node 345 to maintain the drain-to-substrate voltage differential at a level lower than the breakdown voltage during a pad output level transition from the low output voltage level to the high output voltage level.

In the illustrated embodiment, control block 330 is a pulling-down control block for the NMOS transistor 340. For example, the control block 330 may generate a gate potential that is provided to a gate of the NMOS transistor 340 so that the NMOS transistor 340 is turned on when the voltage of the pad 310 is being pulled down. The control block 330 may also generate a gate potential and provide the gate potential to the gate of the NMOS transistor 340 so that the NMOS transistor 340 is turned off when the voltage of the pad 310 is being pulled up.

Figure 4A:
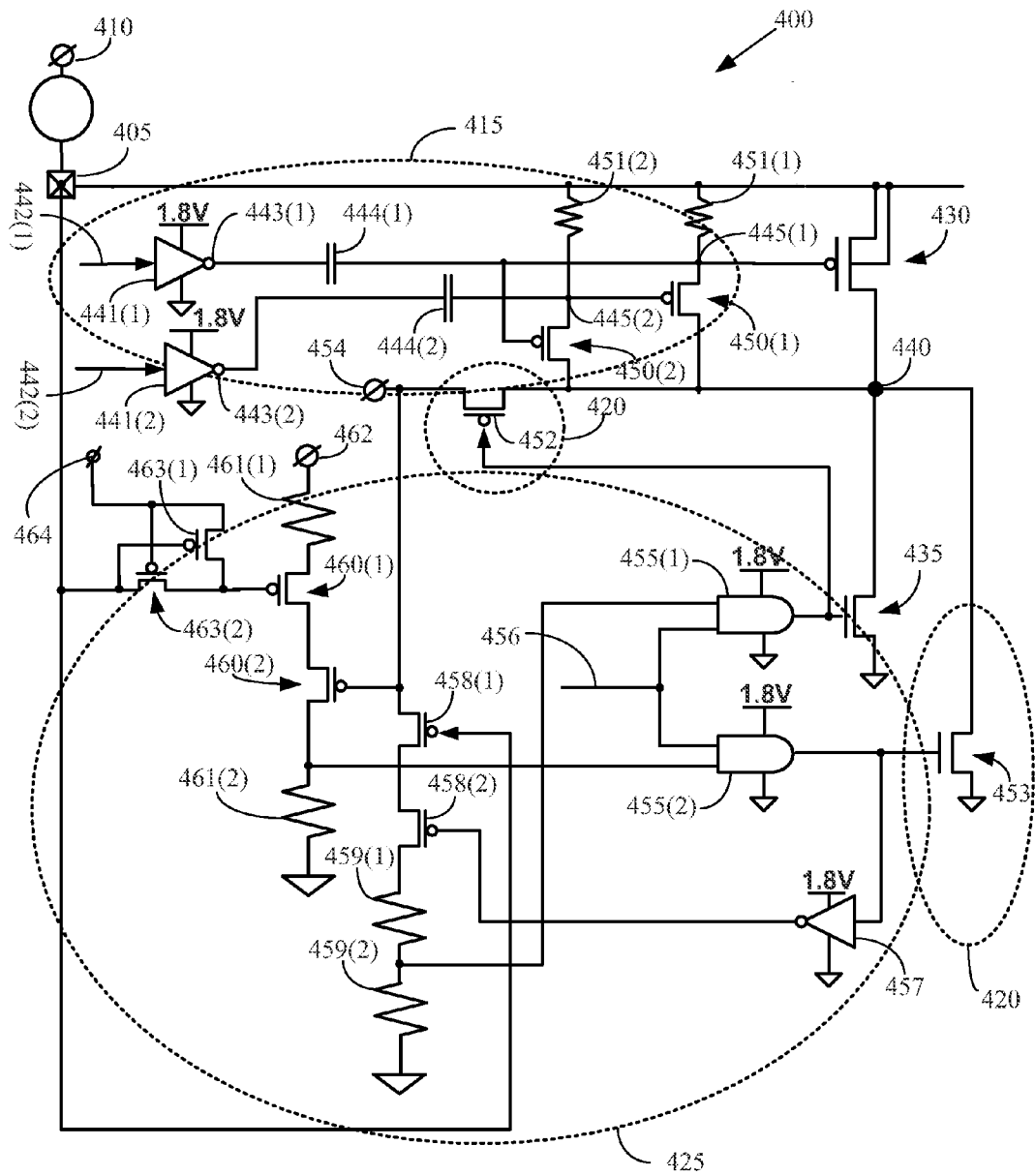
FIG. 4A conceptually illustrates a third exemplary embodiment of a semiconductor device.

FIG. 4A conceptually illustrates a third exemplary embodiment of a semiconductor device 400. In the illustrated embodiment, the semiconductor device 400 includes a buffer that is connected to a pad 405. The pad 405 is also connected to voltage source 410 through an external pull up circuit. The buffer is formed of transistors, resistors, or other elements that make up a voltage tracking block 415, a safety block 420, a control block 425, a PMOS transistor 430, and an NMOS transistor 435. The PMOS transistor 430 and the NMOS transistor 435 are connected in series between the pad 405 and ground. A source terminal for the PMOS transistor 430 is connected to a drain terminal for the NMOS transistor 435 via an intermediate node 440.

The voltage control block 415 includes inverters 441 that receive input signals 442 from control logic and provide inverted outputs of the input signals to nodes 443. Capacitors 444 are coupled in series between the nodes 443 and nodes 445, which are connected to gates of the PMOS transistor 430 and PMOS transistors 450. The nodes 445 are also connected to drains of the PMOS transistors 450. Resistors 451 are coupled between the pad 405 and nodes 445. The safety block 420 includes PMOS transistor 452 and NMOS transistor 453. The PMOS transistor 452 receives a gate control signal from the control block 425 and is connected to a voltage source 454 that provides a voltage below the breakdown voltage of the PMOS transistor 452, e.g., a voltage of approximately 1.8 V.

In the illustrated embodiment, the control block 425 includes AND gates 455 that receive a data signal 456 from control logic. The AND gates 455 provide output values to gates of the NMOS transistors 435, 453. The AND gate 455(1) also provides an output value to the gate of the PMOS transistor 452. The AND gate 455(2) provides an output signal to inverter 457. The control block 425 also includes transistors 458 and resistors 459 coupled in series between the voltage source 454 and ground. The control block 425 also includes transistors 460 and resistors 461 coupled in series between the voltage source 462 (which provides a voltage that corresponds to the high voltage provided by the voltage source 410) and ground. Transistors 463 are also included in the control block 425 and are coupled to the pad 405 and a voltage source 464 that provides a voltage below the nominal breakdown voltage.

Figure 4B:
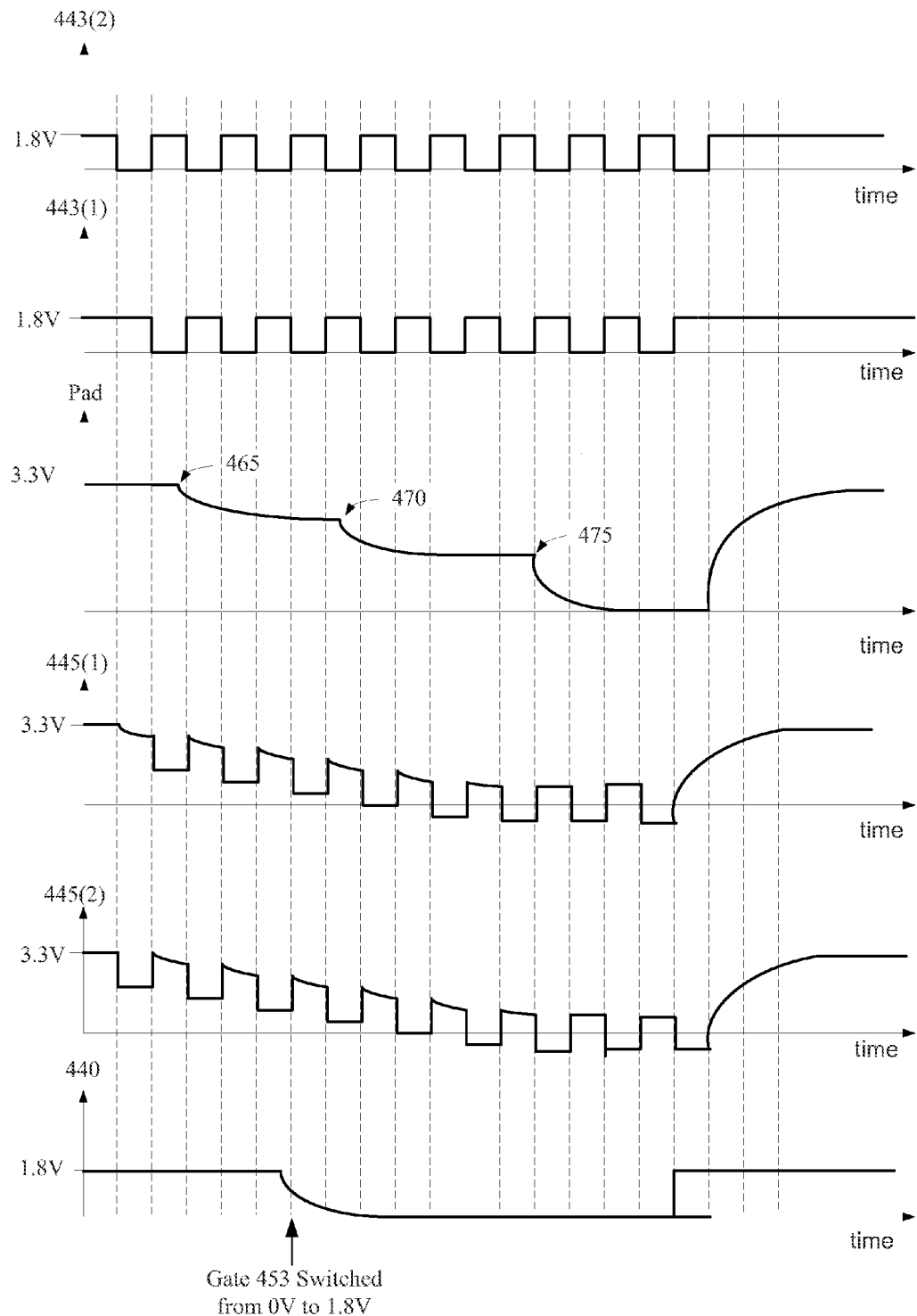
FIG. 4B conceptually illustrates voltage levels at various nodes in the semiconductor device shown in FIG. 4A.

FIG. 4B conceptually illustrates voltage levels at various nodes in the semiconductor device 400 shown in FIG. 4A. Each set of axes indicate increasing voltage on the vertical axis and increasing time along the horizontal axis. The axes are labeled by the numerals used to indicate the corresponding nodes or elements in FIG. 4A. In operation, core logic provides an inverted data signal 456 as a DC signal having a first voltage (e.g., 0 V) during a pull-up transaction and a second voltage (e.g., 1.8 V) during a pull down transaction. The core logic also provides input signals 442 that can be toggled to pull down the pad voltage. The core logic can set both of the input signals 442 to the second voltage (e.g., 1.8 V) to pull up the pad voltage. In the illustrated embodiment, the external voltage is 3.3 V and the breakdown voltage is less than 3.3V. However, persons of ordinary skill in the art having benefit of the present disclosure should appreciate that alternative embodiments may use different values of the external voltage or the nominal breakdown voltage.

Voltage differentials applied to transistors in the semiconductor device 400 remain below the breakdown voltage of the transistors during pull-up or pull down of the pad voltage. For example, for a pull down transaction, the pad voltage is initially at the high voltage (e.g., 3.3 V) provided by the voltage source 410. The inverted data 456 is set to 0 V and the input signals 442 are also set to 0 V so that the inverters 441 generate a 1.8 V signal at the nodes 443. Because the inverted data 446 provides a 0 V inputs to the AND gates 455, the AND gates 455 provide a 0 V output so that the NMOS transistors 435, 453 are turned off initially. The pad provides the high 3.3 V potential through the resistors 451 to gates of the PMOS transistors 430, 450. The pad also provides the 3.3 V potential through the PMOS transistor 463(2) to the gate of the PMOS transistor 460(1), which keeps the PMOS transistor 460(1) turned off and allows the potential of 0 V to be passed through the resistor 461(2) to the input of AND gate 455(2). The inverter 457 receives the 0 V input and therefore provides a 1.8 V potential to the gate of the PMOS transistor 458(1). In the illustrated embodiment, voltage supply 462 is equal to the first voltage level (e.g. 3.3V) and voltage supply 454 is equal to the second voltage level (e.g. 1.8V).

Initially, the 3.3 V pad voltage is also present at the gate of the PMOS transistor 458(1) so that both the PMOS transistors 458 are in the off state, which allows the 0 V potential to be passed through the resistor 459(2) to an input of the AND gate 455(1). The AND gate 455(1) therefore provides a 0 V output that keeps the PMOS transistor 452 in the safety block 420 in the on state so that the node 440 remains at the 1.8 V potential provided by the voltage source 454. In this initial state, voltage differentials applied between the drains, sources, gates, or substrates of the transistors in the buffer are less than the transistors' nominal break-down voltage level.

The pad voltage may be pulled down by changing the inverted data level at the node 456 from 0 V to 1.8 V and described core logic activities. In one embodiment, core logic decides to transmit a low voltage using the pad 405 and changes the inverted data level at the node 456. Changing the inverted data 456 does not change outputs of the AND gates 455 because the second inputs to the gates remain at 0 V. Thus, 0 V are applied to the gates of the NMOS transistors 435, 453, which keeps these transistors in the off state. Concurrently with or after the inverted data level 456 has been asserted to a high state (1.8 V in this case), the core logic may begin toggling inputs to the inverters 441. In the embodiment depicted FIG. 4B, the core logic provides the sequence of pulses "001010101010 . . . " to the inverter 441(1) and the sequence of pulses "01010101010 . . . " to the inverter 441(2). The inverted pulses at the nodes 443 are therefore "110101010101 . . . " at the node 443(1) and "10101010101 . . ." at the node 443(2), as shown in FIG. 4B. The toggled inputs to the inverters 441 are 1800 out of phase with each other.

Changing the potential at the node 443(2) from 1.8 V to 0 V causes the potential at the node 445(2) to change from 3.3 V to 3.3 V−1.8 V=1.5 V. The 1.5 V potential at the node 445(2) turns on the PMOS transistor 450(1) and the capacitor 444(2) begins to discharge through the PMOS transistor 450(1) and the PMOS transistor 452 in the safety block 420. Discharging the capacitor 444(2) decreases the potential at the node 445 (1) that is coupled to the gate of the PMOS transistor 430. Toggling the potential at the node 443(2) from 0 V back to 1.8 V causes the potential at the node 445(2) to increase by 1.8 V and turn off the PMOS transistor 450(1). The potential at the node 443(1) is concurrently toggled from 1.8 V to 0 V and this potential drop is passed through the capacitor 444(1) to decrease the potential at the node 445(1) by 1.8 V from 3.3 V to approximately 1.5 V. The potential drop turns on the PMOS transistor 450(2) and allows the capacitor 444(1) to begin discharging through the PMOS transistors 450(2), 452.

As shown in FIG. 4B, toggling of the inputs 441 may continue iteratively so that the potentials at the nodes 445 gradually decrease. Eventually the potential at the node 445 (1) decreases sufficiently to turn on the PMOS transistor 430 and connect the pad 405 through the PMOS transistors 430, 452 to the 1.8 V potential provided by the voltage source 454. The pad potential therefore begins decreasing to try and reach the 1.8 V potential, as shown at location 465 in FIG. 4B. When the pad potential has decreased to approximately 2.9 V, the PMOS transistor 460(1) is turned on so that the chain of transistors 460 and resistors 461 are in the on state and provide a conducting path between the voltage source 462 and ground. Current flowing through the resistor 461(2) begins to increase and a voltage drop across the resistor 461(2) begins to rise. When the voltage drop across the resistor 461(2) reaches the switching point of the AND gate 455(2), the output of the AND gate 455(2) goes to the high state (1.8 V in this case), which turns on the NMOS transistor 453. In the illustrated embodiment, the transistors 460 and resistors 461 form a resistive divider when the transistors 460 are turned on and the resistive divider identifies the pad potential (3.3 V this case) when the voltage drop across the resistor 461(2) switches the output of the AND gate 455(2) from 0 V to 1.8 V. For one exemplary set of values of the resistors 461, the AND gate 455(2) may switch output of AND gate 455 (2) from 0 V to 1.8 V when pad voltage is approximately 2.4 V.

Turning on the NMOS transistor 453 causes the pad potential to decrease to a level lower than 1.8 V, as indicated at the location 470 in FIG. 4B. In the illustrated embodiment, the NMOS transistor 453 is included in the safe block 420 to reduce potential drops at the node 440 and to avoid possible "sharp" potential drops at the node 440 to reduce the potential for damage to the PMOS transistors 430, 450 that may occur if their gate potentials (i.e., the potentials at the nodes 445) exceed the safe gate/source/drain potential levels, e.g., 1.8 V in the illustrated embodiment. Changing the output of the AND gate 455(2) from low to high (e.g., from 0 V to 1.8 V in this case) changes the output of the inverter 457 from high to low (e.g., from 1.8 V to 0 V in this case) and turns on the PMOS transistor 458(2). The pad potential is decreasing concurrently with turning on the PMOS transistor 458(2) and once the pad potential reaches a value lower than 1.8 V−$V_{TP}$, where $V_{TP}$ is the threshold voltage of the PMOS transistors 458, the PMOS transistor 458(1) is turned on because the pad potential is applied to the gate of the PMOS transistor 458(1). Turning on the PMOS transistors 458 creates a conductive path from the voltage source 454 to ground through the resistors 459 so that the resistors 459 form a resistive divider. The resistive divider provides a high input to the AND gate 455(1), which then turns off the PMOS transistor 452 by providing a high output to the gate of the PMOS transistor 452. The resistive divider also provides a high output that turns on the NMOS transistor 435, as indicated at the location 475 in FIG. 4B. In the illustrated embodiment, the NMOS transistor is the primary transistor for driving the pad potential to 0 V during pull down.

Toggling the pulses at the inputs 442 alternately charges and discharges the capacitors 444. In the illustrated embodiment, the resistors 451 assist or help the charging and discharging of the capacitors 444. The potential at node 445(1) continues to decrease in response to toggling of the pulses at the inputs 442 to a level lower than 0 V to maintain the PMOS transistor 430 in the on condition during the pull down of the pad voltage. For example, the potential of the node 445(1) may decrease to approximately −1 V so that the PMOS transistor 430 is turned on even when its substrate potential is 0 V. A steady state may be reached when the charge current passing through the resistors 451 is approximately equal to the discharge current for the capacitors 444. The relatively lower potential at the nodes 445 means that a correspondingly larger current passes through the resistors 451 so that the charge and discharge currents are approximately equal. Once this happens, the negative potential at the nodes 445 stops decreasing and enters the steady state. During the pull down process that takes the pad voltage from 3.3 V to 0 V as described herein, the NMOS transistors 435, 453 have drain-to-substrate voltages that remain less than the breakdown voltage for these transistors.

The pad voltage can be pulled up to the high voltage level provided by the voltage source 410 to transmit a "high" signal using the pad 405. In the illustrated embodiment, the transition from 0 V to 3.3 V at the pad 410 may be initiated by switching the inverted data level 456 from 1.8 V to 0 V. Core logic may also stop toggling the inputs 442 and keep both input signals 442 at a low level so that the inverted signal at the nodes 443 remains at a high level, e.g. 1.8 V. Outputs of the AND gates 455 may then be switched from 1.8 V to 0 V, which turns off the NMOS transistors 435, 453. The external voltage source 410 may therefore begin pulling up the pad potential to the 3.3 V level. The rising pad potential eventually shuts down the PMOS transistors 458(1), 460(1) so that the 0 V potential is transmitted through the resistors 459(2), 461(2) to inputs of the AND gates 455. During the pull up process, the NMOS transistors 435, 453 have drain-to-substrate voltages that remain less than the breakdown voltages for these transistors.

Figure 4C:
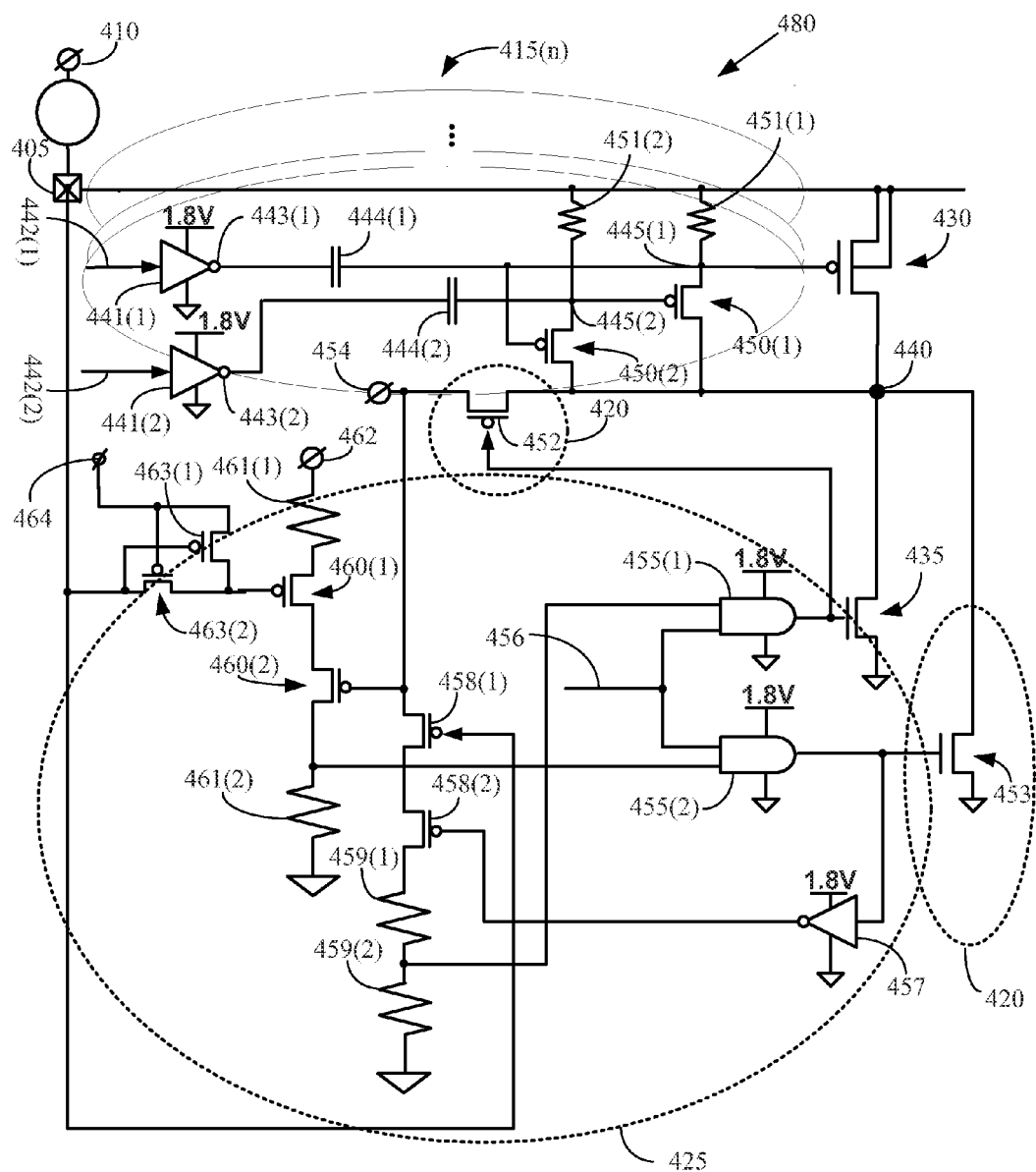
FIG. 4C conceptually illustrates a fourth exemplary embodiment of a semiconductor device.
Figure 4D:
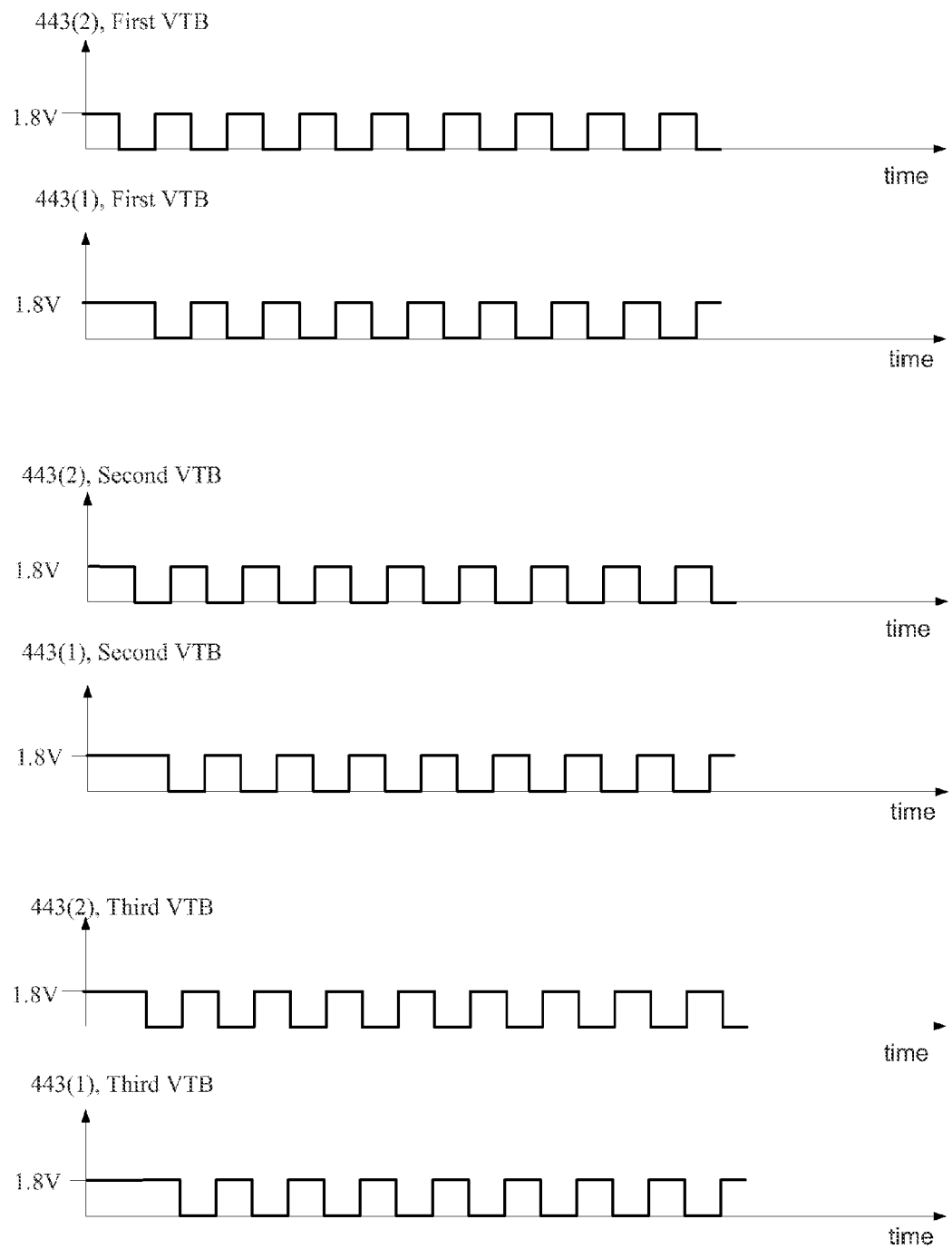
FIG. 4D conceptually illustrates input signals provided to three parallel implementations of a voltage tracking block that may be implemented in embodiments of the semiconductor device shown in FIG. 4C.

FIG. 4C conceptually illustrates a fourth exemplary embodiment of a semiconductor device 480. The fourth exemplary embodiment 480 differs from the third exemplary embodiment 400 depicted in FIG. 4A because the semiconductor device 480 includes multiple (n) implementations of the voltage tracking block 415(1-n). The voltage tracking blocks 415 shown in FIG. 4C are implemented in parallel and can be configured to receive different sets of incoming signals 442 from the core logic. For example, the incoming signals 442 received at the different may be offset by a selected phase difference. As shown in FIG. 4D, the input signals 442 provided to three parallel implementations of the voltage tracking block 415 can be offset by a phase difference that is less than the period of the toggled incoming signals 442. Providing the phase difference between the input signals 442 provided to different voltage tracking blocks 415 may smooth the transition of the pad voltage from 3.3 V to 0 V during pull down and from 0 V to 3.3 V during pull up.

Embodiments of the semiconductor devices 400, 480 shown in the present application may also be used to convey signals from the pad 405 to internal core logic. In one embodiment, the voltage drop across the resistor 461(1) may be used to send a voltage level "0" to core logic when the pad 405 is at 3.3V potential or level "1" to the core logic when pad 405 is at 0V potential. For example, when the pad 405 is at 3.3V potential the 3.3V voltage can be conveyed through PMOS transistor 463(2) to shut down PMOS transistor 460(1). The voltage drop across the resistor 461(2) may then be 0V and this may be conveyed to the core logic. For another example, if the pad 405 is at 0V potential then 1.8V voltage may be conveyed through PMOS transistor 463(2) to turn on PMOS transistor 460(1). The transistors 460 may then be in a conducting state and the voltage drop across the resistor 461(1) may be identified as approximately equal to 3.3V·R5/(R5+ R4). The logical level "1" indicated by this voltage may then be sent to the core logic when the pad 405 is at 0V potential.

Embodiments of semiconductor devices that include on-chip buffers as described herein (such as the semiconductor device 200) can be fabricated in semiconductor fabrication facilities according to various processor designs. In one embodiment, a processor design can be represented as code stored on a computer readable media. Exemplary codes that may be used to define and/or represent the processor design may include HDL, Verilog, and the like. The code may be written by engineers, synthesized by other processing devices, and used to generate an intermediate representation of the processor design, e.g., netlists, GDSI data and the like. The intermediate representation can be stored on computer readable media and used to configure and control a manufacturing/fabrication process that is performed in a semiconductor fabrication facility. The semiconductor fabrication facility may include processing tools for performing deposition, photolithography, etching, polishing/planarization, metrology, and other processes that are used to form transistors and other circuitry on semiconductor substrates. The processing tools can be configured and are operated using the intermediate representation, e.g., through the use of mask works generated from GDSII data.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. An apparatus, comprising:
   a pad configurable for connection to a voltage source that provides a first voltage; and
   a buffer connected to the pad, wherein the buffer comprises a plurality of transistors that have nominal breakdown voltages that are less than the first voltage, the plurality of transistors comprising a PMOS transistor and an NMOS transistor connected in series between the pad and ground, and wherein the buffer is configured to maintain voltage differentials on the plurality of transistors that are less than a breakdown voltage of the plurality of transistors during pull-down of a pad voltage from the first voltage to a selected low voltage level or during pull-up of the pad voltage from the selected low voltage level to the first voltage, and wherein the first voltage is higher than the breakdown voltage.

2. The apparatus of claim 1, comprising the voltage source, and wherein the voltage source is electrically connected to the pad to provide the first voltage that corresponds to a voltage used by an external interface when connected to the pad.

3. The apparatus of claim 2, wherein the first voltage is substantially equal to 3.3 Volts (V), the selected low voltage level is substantially equal to 0 V, and the breakdown voltage is between 3.3 V and 1.8 V.

4. The apparatus of claim 1, wherein the buffer comprises a voltage tracking block configurable to provide a gate potential to the PMOS transistor based on the pad voltage, wherein the voltage tracking block comprises a portion of the plurality of transistors having the breakdown voltage that is less than the first voltage.

5. The apparatus of claim 4, wherein the voltage tracking block is configurable to provide a negative gate potential when the pad voltage is substantially equal to 0 V.

6. The apparatus of claim 4, wherein the buffer comprises a plurality of voltage tracking blocks configurable to provide the gate potential to the PMOS transistor based on the pad voltage.

7. The apparatus of claim 4, wherein the buffer comprises a safety block configurable to control a voltage at a node intermediate the PMOS transistor and the NMOS transistor so that voltage differentials across the NMOS transistor are less than the breakdown voltage during pull-down of the pad voltage from the first voltage to a selected low voltage level or during pull-up of the pad voltage from the selected low voltage level to the first voltage.

8. The apparatus of claim 7, wherein the buffer comprises a control block configurable to provide a gate voltage to turn on the NMOS transistor during pull-down of the pad voltage from the first voltage to the selected low voltage level.

9. The apparatus of claim 8, wherein the control block is configurable to provide the gate voltage to turn off the NMOS transistor during pull-up of the pad voltage from the selected low voltage level to the first voltage.

10. An apparatus, comprising:
a pad configurable for connection to a voltage source that provides a first voltage;
a buffer connected to the pad, wherein the buffer comprises a plurality of transistors that have a breakdown voltage that is less than the first voltage, wherein the plurality of transistors comprises a PMOS transistor and an NMOS transistor connected in series between the pad and ground; and
core logic communicatively coupled to the buffer, wherein the core logic is configurable to provide a data signal and input signals to the buffer to drive a pad voltage to a value indicated by the data signal, and wherein the buffer is configured to maintain voltage differentials on the plurality of transistors that are less than the breakdown voltage during pull-down of the pad voltage from the first voltage to a selected low voltage level or during pull-up of the pad voltage from the selected low voltage level to the first voltage.

11. The apparatus of claim 10, wherein the core logic and the buffer are configurable to drive the pad voltage to the value indicated by the data signal to transmit information in the data signal to an external interface connected to the pad.

12. The apparatus of claim 10, wherein the buffer comprises a voltage tracking block configurable to receive the input signals from the core logic and to provide a gate potential to the PMOS transistor based on the pad voltage and the input signals, wherein the voltage tracking block comprises a portion of the plurality of transistors having the breakdown voltage.

13. The apparatus of claim 12, wherein the buffer comprises a plurality of voltage tracking blocks configurable to receive the input signals from the core logic and to provide the gate potential to the PMOS transistor based on the pad voltage and the input signals, and wherein the input signals provided to different voltage tracking blocks are offset by a phase difference.

14. The apparatus of claim 12, wherein the buffer comprises a safety block configurable to control a voltage at a node intermediate the PMOS transistor and the NMOS transistor based on the data signal, wherein the safety block is configurable to control the voltage at the node so that voltage differentials across the NMOS transistor are less than the breakdown voltage during pull-down of the pad voltage from the first voltage to the selected low voltage level or during pull-up of the pad voltage from the selected low voltage level to the first voltage.

15. The apparatus of claim 14, wherein the buffer comprises a control block configurable to receive the data signal from the core logic and provide a gate voltage based on the data signal to turn on the NMOS transistor during pull-down of the pad voltage from the first voltage to the selected low voltage level.

16. The apparatus of claim 15, wherein the control block is configurable to provide the gate voltage based on the data signal to turn off the NMOS transistor during pull-up of the pad voltage from the selected low voltage level to the first voltage.

17. A non-transitory computer readable medium including instructions that when executed configure a manufacturing process used to manufacture a semiconductor device comprising:
a pad configurable for connection to a voltage source that provides a first voltage; and
a buffer connected to the pad, wherein the buffer comprises a plurality of transistors that have a breakdown voltage that is less than the first voltage, the plurality of transistors comprising a PMOS transistor and an NMOS transistor connected in series between the pad and ground, and wherein the buffer is configured to maintain voltage differentials on the plurality of transistors that are less than a breakdown voltage of the plurality of transistors during pull-down of a pad voltage from the first voltage to a selected low voltage level or during pull-up of the pad voltage from the selected low voltage level to the first voltage, and wherein the first voltage is higher than the breakdown voltage.

18. A non-transitory computer readable medium including instructions that when executed configure a manufacturing process used to manufacture a semiconductor device comprising:
a pad configurable for connection to a voltage source that provides a first voltage;
a buffer connected to the pad, wherein the buffer comprises a plurality of transistors that have a breakdown voltage that is less than the first voltage, and wherein the plurality of transistors comprises a PMOS transistor and an NMOS transistor connected in series between the pad and ground; and
core logic communicatively coupled to the buffer, wherein the core logic is configurable to provide a data signal and input signals to the buffer to drive a pad voltage to a value indicated by the data signal, and wherein the buffer is configured to maintain voltage differentials on the plurality of transistors that are less than a break down voltage of the plurality of transistors during pull-down of the pad voltage from the first voltage to a selected low voltage level or during pull-up of the pad voltage from the selected low voltage level to the first voltage, and wherein the first voltage is higher than the breakdown voltage.

* * * * *